United States Patent
Moore et al.

(10) Patent No.: US 7,024,653 B1
(45) Date of Patent: Apr. 4, 2006

(54) ARCHITECTURE FOR EFFICIENT IMPLEMENTATION OF SERIAL DATA COMMUNICATION FUNCTIONS ON A PROGRAMMABLE LOGIC DEVICE (PLD)

(75) Inventors: Michael T. Moore, Santa Clara, CA (US); James Lie, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 886 days.

(21) Appl. No.: 09/703,181

(22) Filed: Oct. 30, 2000

(51) Int. Cl.
G06F 17/50 (2006.01)
G06F 9/00 (2006.01)
G06F 15/177 (2006.01)
H01L 25/00 (2006.01)
H04L 12/66 (2006.01)

(52) U.S. Cl. .............. 716/16; 716/17; 716/18; 326/41; 326/47; 326/101; 710/10; 713/1; 713/100; 709/221; 370/366

(58) Field of Classification Search .......... 716/1–21; 326/41, 47, 101; 710/10; 713/1, 100; 370/366; 709/221
See application file for complete search history.

(56) References Cited

U.S. PATENT DOCUMENTS

| | | | |
|---|---|---|---|
| 3,851,258 A * | 11/1974 | Freedman | 327/115 |
| 4,811,361 A * | 3/1989 | Bacou et al. | 375/242 |
| 4,849,904 A * | 7/1989 | Aipperspach et al. | 716/17 |
| 4,870,346 A * | 9/1989 | Mydill et al. | 324/73.1 |
| 5,457,786 A * | 10/1995 | Roush | 710/100 |
| 5,687,325 A * | 11/1997 | Chang | 710/104 |
| 5,745,734 A * | 4/1998 | Craft et al. | 716/16 |
| 5,812,414 A * | 9/1998 | Butts et al. | 716/16 |
| 5,815,405 A * | 9/1998 | Baxter | 716/16 |
| 5,815,510 A * | 9/1998 | Jones et al. | 714/724 |
| 5,825,202 A * | 10/1998 | Tavana et al. | 326/399 |
| 5,875,200 A * | 2/1999 | Glover et al. | 714/784 |
| 5,892,961 A * | 4/1999 | Trimberger | 712/10 |
| 5,942,914 A * | 8/1999 | Reddy et al. | 326/39 |
| 5,943,488 A * | 8/1999 | Raza | 716/17 |
| 5,946,478 A * | 8/1999 | Lawman | 716/16 |
| 5,959,466 A * | 9/1999 | McGowan | 326/39 |
| 6,008,666 A * | 12/1999 | Conn | 326/39 |
| 6,023,565 A * | 2/2000 | Lawman et al. | 716/1 |
| 6,049,487 A * | 4/2000 | Plants et al. | 365/189.04 |
| 6,052,773 A * | 4/2000 | DeHon et al. | 712/43 |
| 6,060,902 A * | 5/2000 | Albu et al. | 326/38 |
| 6,094,065 A * | 7/2000 | Tavana et al. | 326/39 |
| 6,107,824 A * | 8/2000 | Reddy et al. | 326/37 |
| 6,107,826 A * | 8/2000 | Young et al. | 326/41 |

(Continued)

*Primary Examiner*—Matthew Smith
*Assistant Examiner*—Phallaka Kik
(74) *Attorney, Agent, or Firm*—Bradley T. Sako (57) ABSTRACT

According to one embodiment, an integrated circuit (100) includes a programmable portion (102) and a communication portion (104). A programmable portion (102) may include logic circuits that are configurable by a user. A communication portion (104) may include one or more circuit blocks designed to perform predetermined serial data communication functions. According to one embodiment, a communication portion (104) may include a block converter (218) that can encode/decode input data words into output data words, and a scrambler circuit (220) for scrambling/de-scrambling data according to a predetermined scrambling polynomial value. Different scrambling polynomial values may be selected from an operation control store (206) to provide a variety of different scrambling/de-scrambling functions. The inclusion of a communication portion (104) may reduce the size and/or increase the speed of an integrated circuit over conventional approaches that may synthesize serial data communication functions from programmable logic circuits.

15 Claims, 4 Drawing Sheets

U.S. PATENT DOCUMENTS

| | | | |
|---|---|---|---|
| 6,127,865 A * | 10/2000 | Jefferson | 327/149 |
| 6,147,890 A * | 11/2000 | Kawana et al. | 365/49 |
| 6,148,384 A * | 11/2000 | Devanagundy et al. | 711/163 |
| 6,154,869 A * | 11/2000 | Wolf | 714/784 |
| 6,173,358 B1 * | 1/2001 | Combs | 711/100 |
| 6,181,164 B1 * | 1/2001 | Miller | 326/46 |
| RE37,048 E * | 2/2001 | McCollum | 708/230 |
| 6,212,639 B1 * | 4/2001 | Erickson et al. | 713/200 |
| 6,219,824 B1 * | 4/2001 | Borland | 326/38 |
| 6,236,229 B1 * | 5/2001 | Or-Bach | 326/39 |
| 6,260,087 B1 * | 7/2001 | Chang | 710/100 |
| 6,288,970 B1 * | 9/2001 | Reddy et al. | 365/230.05 |
| 6,292,923 B1 * | 9/2001 | Genrich et al. | 714/795 |
| 6,314,551 B1 * | 11/2001 | Borland | 716/17 |
| 6,317,804 B1 * | 11/2001 | Levy et al. | 710/305 |
| 6,326,812 B1 * | 12/2001 | Jefferson | 326/93 |
| 6,373,278 B1 * | 4/2002 | Sung et al. | 326/38 |
| 6,426,649 B1 * | 7/2002 | Fu et al. | 326/41 |
| 6,437,713 B1 * | 8/2002 | Lesea | 341/78 |
| 6,442,739 B1 * | 8/2002 | Palermo et al. | 716/6 |
| 6,462,577 B1 * | 10/2002 | Lee et al. | 326/40 |
| 6,487,648 B1 * | 11/2002 | Hassoun | 711/167 |
| 6,525,562 B1 * | 2/2003 | Schultz et al. | 326/39 |
| 6,525,678 B1 * | 2/2003 | Veenstra et al. | 341/55 |
| 6,539,051 B1 * | 3/2003 | Grivna | 375/219 |
| 6,552,410 B1 * | 4/2003 | Eaton et al. | 257/530 |
| 6,578,104 B1 * | 6/2003 | Small et al. | 711/104 |
| 6,590,419 B1 * | 7/2003 | Betz et al. | 326/47 |
| 6,609,167 B1 * | 8/2003 | Bastiani et al. | 710/104 |
| 6,628,725 B1 * | 9/2003 | Adam et al. | 375/259 |
| 6,724,829 B1 * | 4/2004 | Tzukerman et al. | 375/295 |
| 6,732,068 B1 * | 5/2004 | Sample et al. | 703/24 |
| 6,763,506 B1 * | 7/2004 | Betz et al. | 716/6 |
| 6,791,353 B1 * | 9/2004 | Beal et al. | 326/39 |
| 6,803,785 B1 * | 10/2004 | May et al. | 326/39 |
| 6,810,434 B1 * | 10/2004 | Muthujumaraswathy et al. | 710/5 |
| 6,839,889 B1 * | 1/2005 | Liu | 716/18 |
| 6,864,710 B1 * | 3/2005 | Lacey et al. | 326/39 |
| 2001/0033188 A1 * | 10/2001 | Aung et al. | 327/141 |
| 2001/0056561 A1 * | 12/2001 | Rub | 714/746 |
| 2002/0015401 A1 * | 2/2002 | Subramanian et al. | 370/347 |
| 2003/0014620 A1 * | 1/2003 | Hanjani | 713/1 |
| 2003/0208723 A1 * | 11/2003 | Killian et al. | 716/1 |
| 2005/0069224 A1 * | 3/2005 | Nowicki et al. | 382/298 |
| 2005/0071800 A1 * | 3/2005 | Liu | 716/18 |
| 2005/0086627 A1 * | 4/2005 | Brekne | 716/18 |

* cited by examiner

ARCHITECTURE FOR EFFICIENT IMPLEMENTATION OF SERIAL DATA COMMUNICATION FUNCTIONS ON A PROGRAMMABLE LOGIC DEVICE (PLD)

TECHNICAL FIELD

The present invention relates generally to programmable logic devices (PLDs), and more particularly to PLDs that may be configured for data communication applications.

BACKGROUND OF THE INVENTION

Programmable logic has increasingly become a valued resource for system designers. Programmable logic can allow for a custom logic design to be implemented without the initial cost, delay and complexity of designing and fabricating an application specific integrated circuit (ASIC).

Currently, there are many variations of programmable logic, including simple programmable logic devices (SPLDs), complex PLDs (CPLDs), and field programmable gate arrays (FPGAs) (referred to herein collectively as programmable logic devices (PLDs)).

While PLDs can have numerous applications, one application of increasing value is serial data communications. Increasingly, various electronic devices can communicate with one another with serial data streams of various protocols. A number of factors can effect the efficiency of serial communications. In particular, for many transmission media, it can be desirable to balance bit data values (i.e., the number of consecutive "1" or "0" values). Such balancing is also referred to as generating encoded values having a low (or zero) DC component. Balanced data values can limit baseband wander in a data carrying signal. Along these same lines, it can also be desirable to include a minimum density in the number of transitions in a data value. Transition density can aid in recovering a clock signal for a serial data stream.

One of the many approaches to balancing bit data values includes encoding data words of one bit length into longer bit length data words. Such longer data words may, in some cases, have the same number of zeros and ones. Alternatively, in cases of value mapping, an input data word may be encoded into an output data word having the same bit size.

Among the various well-known encoding schemes are 4/5 bit encoding and 8/10 bit encoding. Such encoding operations will be referred to herein generally as x/y encoding/decoding, where it is understood that x and y are numbers of bits, with x being the number of bits before an encoding operation (or after a decoding operation) and y being the number of bits after an encoding operation (or before a decoding operation). While in many applications x<y, in other operations x=y and/or x>y.

An encoding operation may encode data words of x bits into data words of y bits for various reasons, including those described above. A decoding operation may receive encoded data words of y bits and generate original data words of x bits.

Another type of encoding that may be useful for clock recovery functions is "scrambling." Scrambling can essentially detect when a sequence of consecutive bits has the same value, and can periodically insert an additional value that may ensure a transition in state occurs within a predetermined time frame. In many cases, a scrambling circuit may include, or be functionally equivalent to, a serial arrangement of shift registers with one or more feedback stages. Such functions may be expressed as a polynomial. Polynomial representation of scrambling functions and circuits are well-known in the art. Further, as in the case of x/y encoding and decoding, scrambling functions may have corresponding de-scrambling functions for extracting the added states.

As noted above, serial data communications can be an important application for an integrated circuit. While fully custom application specific integrated circuits (ASICs) can be developed to meet a particular application, such approaches may be expensive and inflexible. Such approaches can incur expenses, as manufacturing components (e.g., masks, packaging etc.) may have to be custom developed for the ASIC. Such approaches may be inflexible, as changes in a design can be difficult to accommodate without altering existing manufacturing components.

As an alternative to an ASIC, conventional programmable logic solutions have programmed programmable logic devices with serial data communication functions. A typical programmable logic approach can include expressing a desired function in a higher-level design language. Such a function may then be synthesized into actual programmable logic gate configuration/interconnections.

A drawback to such conventional approaches can be the gate "cost" of realizing such serial communication functions on a PLD. As but one example, a conventional 8/10 bit encoder/decoder has been known to require 11,500 gates on a FPGA. Dedicating such a number of gates to one function of a serial communication application reduces the ability of a programmable logic device to accommodate any other functions.

Another drawback to conventional PLD approaches can be flexibility. The particular type of x/y encoding utilized in a system may differ according to particular communication standards. That is, one serial communication standard may have one type of 8/10 bit encoding/decoding, while a second may have a different type of x/y encoding/decoding, while a third may have one type of 4/5 bit encoding/decoding. Likewise, a particular polynomial for scrambling/de-scrambling can likewise vary between standards. Consequently, while one PLD configuration can be synthesized to meet one standard, re-design and re-synthesis may have to be performed to meet a different standard using a different type of encoding/scrambling.

Yet another drawback to conventional programmable logic approaches to serial communication applications can be timing requirements for such applications. For example, in some applications, serial communication operations may have to function in synchronism with a 125 MHz system clock, have input set-up times of about 1.5 nS, latch hold times of about 1.0 nS, and clock to output times of about 5.5 nS. Such timing constraints can be difficult to meet, as a synthesized solution may include signal propagation paths that include gates that are not necessary of a given function, but result from the logic gate layout of a PLD.

In light of the above discussion, it would be desirable to arrive at some way of providing an integrated circuit for serial communication applications that can be more flexible than conventional ASIC and PLD approaches.

It would also be desirable to arrive at some way of providing a programmable device that can provide serial data communication functions without necessarily consuming as many programmable resources as conventional PLD approaches.

SUMMARY OF THE INVENTION

The present invention includes an integrated circuit having a programmable portion and a communication portion. A programmable portion may include user configurable gates, such as those in conventional programmable logic devices (PLD). A communication portion may include circuits designed to perform predetermined communication functions. As but two examples, such predetermined functions may include x/y encoding and/or decoding, and/or scrambling and/or de-scrambling. A communication portion can be smaller and/or faster in operation than conventional approaches that may synthesize such functions with a number of programmable logic gates.

According to one aspect of the embodiments, a particular function provided by a communication portion may be selectable. In one arrangement, multiple functions may be performed on input data, with the resulting output being provided according to a data output multiplexer.

According to another aspect of the embodiments, a particular operation performed by a communication function may be performed according to a value that can be selected and provided to circuit block. Selectable values may include scrambling polynomials. Further, such selectable values may include values that are preset by a manufacturer and values that are programmed by a user.

According to another aspect of the embodiments, an integrated circuit may include multiple communication portions, each of which may provide selectable functions and/or selectable input values for a circuit block.

DETAILED DESCRIPTION OF THE EMBODIMENTS

Various embodiments will now be described in conjunction with a number of diagrams. The embodiments set forth a programmable logic device (PLD) that may include circuits dedicated to one or more particular serial communication functions. All, or a portion of such circuits may be formed specifically for such functions, as opposed to being configured by a conventional design and synthesis process. Serial data values may be received, and operated on according to variables that are hardwired or programmed into the device. Different variables are selectable to enable different applications, such as encoding/de-coding and/or scrambling/de-scrambling.

Figure 1:
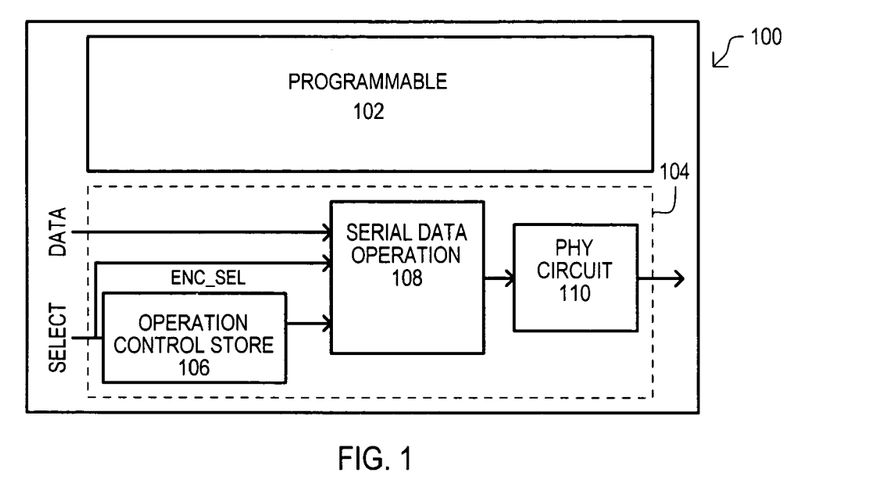
FIG. 1 is a block diagram of a first embodiment of the present invention.

Referring now to FIG. 1, an integrated circuit (IC) according to a first embodiment is set forth in a block diagram and designated by the general reference character 100. An IC 100 may include a programmable portion 102 and a communication portion 104. A programmable portion 102 may include programmable logic circuits that may be configured by a user according to well-known techniques (e.g., high-level design language and synthesis). A communication portion 104 may include integrated circuits particularly designed to provide serial data communication functions. In one arrangement, a communication portion 104 may be formed from non-programmable circuits. In another arrangement, a communication portion 104 may have some circuits formed from programmable logic circuits, with the remainder being formed from non-programmable circuits.

A programmable portion 102 may be formed in the same semiconductor substrate as a communication portion 104. That is, in one arrangement, a communication portion 104 may be a circuit or collection of circuits embedded into a programmable logic device (PLD).

As shown in FIG. 1, a communication portion 104 may include an operation control store 106, a serial data operation circuit 108, and physical layer circuit 110. A serial data operation circuit 108 may receive data words, and perform one or more predetermined operations on such data words (e.g., encode/scramble/decode/de-scramble). How, and/or which particular operation may be performed can be controlled according to a control value supplied from an operation control store 106, and/or a function select value ENC_SEL supplied as an input to a communication portion 104.

An operation control store circuit 106 may store a number of control values. A select input SELECT can determine which particular operation can be performed by a serial data operation circuit 108. In one arrangement, an operational control store circuit 106 may include both preset control values as well as user programmable control values. In this way, an externally supplied select signal SEL can establish a particular serial communication function provided by an IC 100.

A physical layer circuit 110 can convert data values output from a serial data operation circuit 108 into a serial stream of data bits. A physical layer circuit 110 may include amplifier circuits and timing circuits to ensure that a serial data output stream can meet various requirements for a particular transmission media.

It is understood that data input to a serial data operation circuit 108 does not necessarily have to be received in a serial manner. Data may be received in parallel word form or other formats.

Thus, according to a first embodiment, an IC 100 may include a communication portion 104 that may provide one of many possible operations according an operation control value selected from an operational control store 106 and/or a function selected by ENC_SEL signal. Further, because all, or a portion of a communication portion 104 may include circuits specifically designed for particular functions, such circuits may be smaller than and/or faster than conventional programmable logic approaches that may form such circuits from configured programmable logic gates. Such faster circuits may enable stringent timing requirements for serial data communication functions to be met. Such smaller circuits may be more cost-effective from a manufacturing standpoint.

Figure 2A:
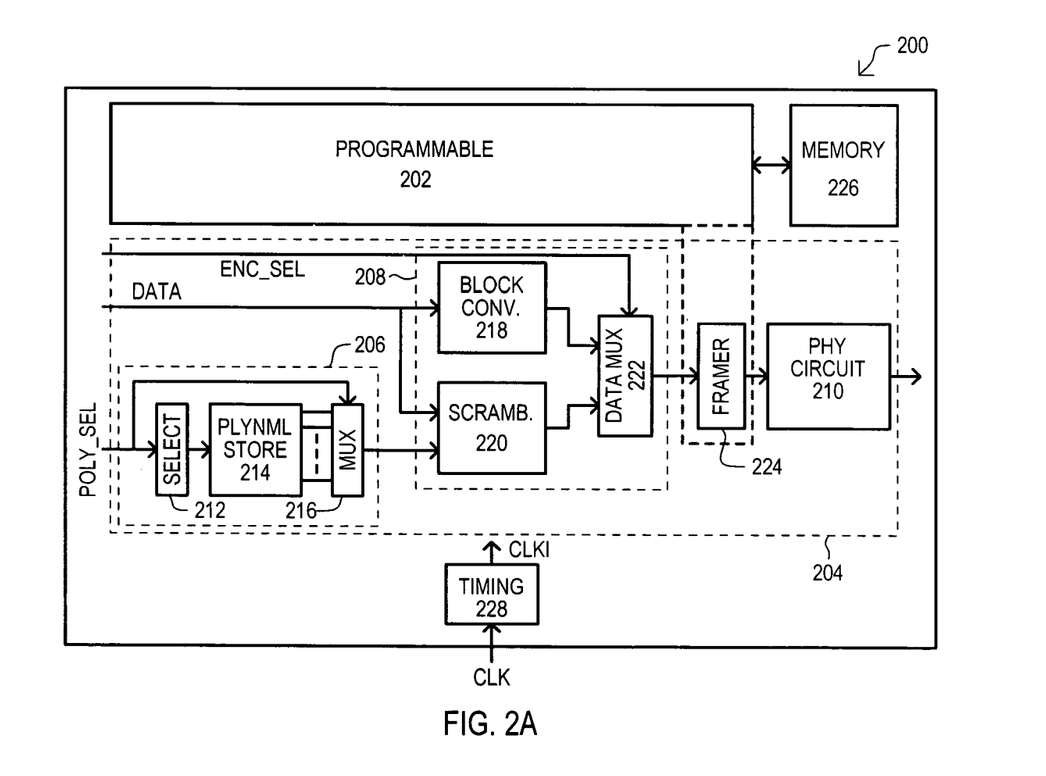
FIGS. 2A and 2B are block diagrams of a second and third embodiment of the present invention.

Referring now to FIG. 2A, a second embodiment is shown in a block diagram and designated by the general reference character 200. A second embodiment 200 may include an integrated circuit having the same general constituents as that set forth in FIG. 1. To that extent, like constituents will be referred to by the same reference character but with the first digit being a "2" instead of a "1."

According to a second embodiment 200, an operation control store 206 may include a polynomial select circuit 212, a polynomial store 214, and a polynomial output multiplexer (MUX) 216. A polynomial select circuit 212 may select a polynomial value from numerous polynomial values of a polynomial store 214. A polynomial output MUX 216 can provide an output path from a polynomial store 214 to a serial data operation circuit 208.

It is understood that an operational control store 206 may have alternate configurations. As but one example, a polynomial select circuit 212 may operate in a decoder-like function, providing a particular polynomial value as an output in response to a select input SEL. Thus, a polynomial output MUX may not be included. Similarly, a polynomial store 214 may continuously output multiple polynomials, one of which may be selected by a polynomial output MUX 216 according to a select input SEL. Thus, a polynomial select circuit may not be included.

In the second embodiment 200, a serial data operation circuit may include two circuit blocks: a block converter 218 and a scrambler circuit 220. A block converter circuit 218 may receive input data values DATA, and perform one or more operations on such values. Resulting converted data can be supplied as an input to a data MUX 222.

A scrambler circuit 220 may include circuits for scrambling an input data value DATA according to a polynomial value provided by an operation control store 206. Scrambling may occur as described above, introducing transitions into a sequence of serial data values. Resulting scrambled data can be supplied as another input to a data MUX 222.

A data MUX 222 may be controlled by an encoder select signal ENC. According to an encoder select signal value ENC_SEL, data from a block converter 218 or a scrambler circuit 220 can be provided as a data output. A data MUX 222 thus shows one example of a selectable data path for connecting a block converter 218 and scrambler circuit 220 to a data output.

A first embodiment 200 may further include a framer circuit 224. A framer circuit 224 can "frame" data from a data MUX 222. As is well understood, a framer circuit 224 can insert delimiting information (e.g., a particular bit or bit sequence) that can identify the beginning and/or ending of a data frame. Data frames from a framer circuit 224 may be processed by a physical layer circuit 210 in the same general manner as described in conjunction with FIG. 1. A framer circuit 224 may be a fixed circuit formed in a substrate. In addition, or alternatively, a framer circuit 224 may be formed in part or in whole from a programmable portion 202.

A first embodiment 200 may also include a memory circuit 226. A memory circuit 226, as but one example, can store configuration information that can establish the functionality of programmable portion 202. As shown in FIG. 2A, a communication portion 204 may receive one or more internal clock signals CLKI from a timing circuit 228. In the example of FIG. 2A, a timing circuit 228 may generate an internal clock signal CLKI from an external clock signal. In one particular arrangement, a timing circuit 228 may include a phase locked loop or delay locked loop circuit to phase shift an external clock signal CLK, and thereby generate an internal clock signal CLKI.

In this way, an IC 200 may include a programmable portion 202 and serial data communication portion 204, where the serial data communication portion 204 may include selectable preset functions (e.g., block conversion, scrambling). Still further, a selected function may be further varied by controlling how the function is executed (e.g., selecting a polynomial value for a particular type of scrambling).

It is understood that a scrambling polynomial value may take various forms. As but a few of the many possible examples, an operation control store 206 may store particular exponent values, may store bits that indicate particular exponent values that are to be used, or may store, generate and/or receive predetermined signals that configure a scrambler circuit 220 to perform scrambling according to a polynomial. Thus, the polynomial values provided from an operation control store 206 should not be construed as necessarily being limited to one particular form.

Figure 2B:
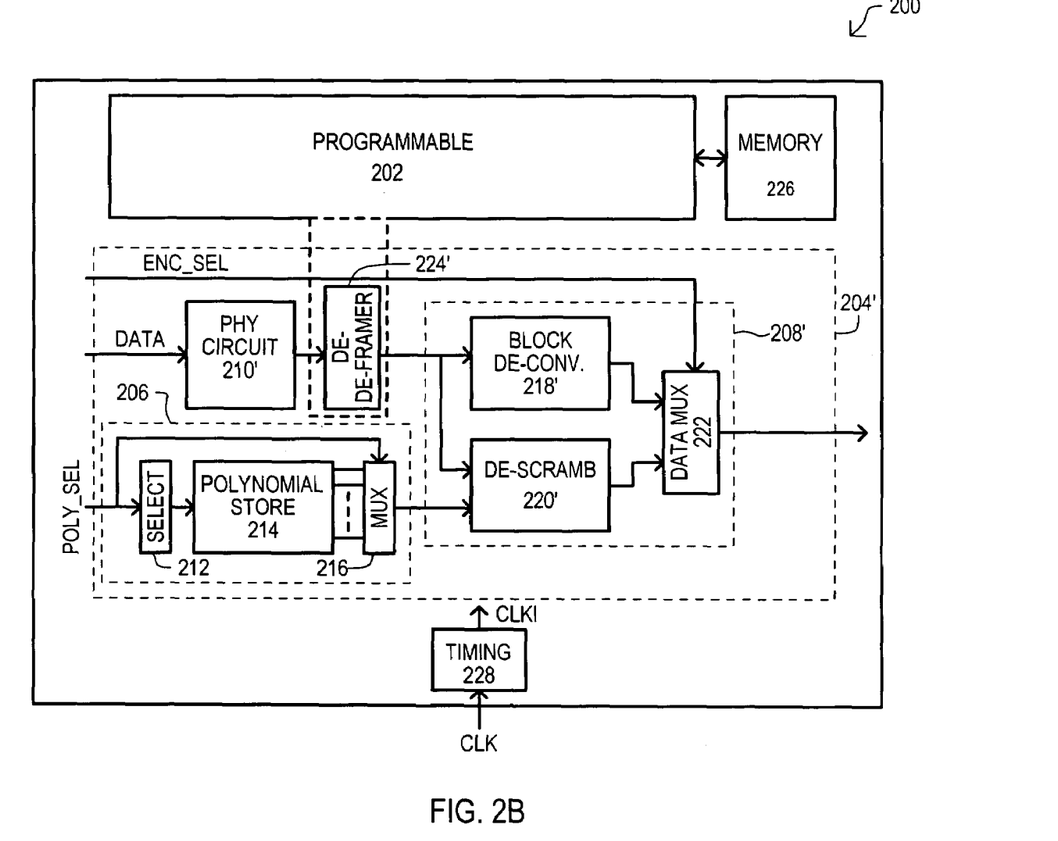

Referring now to FIG. 2B, a third embodiment is set forth in a block diagram and designated by the general reference character 200'. A third embodiment 200' may include an integrated circuit having similar constituents as that set forth in FIG. 1. To that extent, similar constituents will be referred to by the same reference character but further include an apostrophe symbol.

It is noted that a second embodiment 200, such as that shown in FIG. 2A, can be conceptualized as a "transmitting" portion, as data values are received and then encoded/scrambled for transmission. In contrast, a third embodiment 200' can be conceptualized as a receiving portion, as data may be received and decoded/de-scrambled upon reception.

A third embodiment 200' may thus include a physical layer circuit 210' that may receive serial data from a communication medium. A de-framer circuit 224' can remove delimiting information from input data frames, to thereby provide a serial data operation circuit 208' with data words.

A serial data operation circuit 208' may include a block converter circuit 218' that may receive encoded data values DATA, and perform one or more decode operations on such values. Resulting decoded values can be supplied as an input to a data MUX 222.

A de-scrambler circuit 220' may include circuits for de-scrambling an scrambled input data value according to a polynomial value provided by an operation control store 206. De-scrambling may include removing transitions from a sequence of serial data values. Resulting de-scrambled data can be supplied as another input to a data MUX 222.

It is understood that while FIGS. 2A and 2B show transmitting and receiving portions separately, a single integrated circuit could include both a transmitting portion and a receiving portion.

Figure 3:
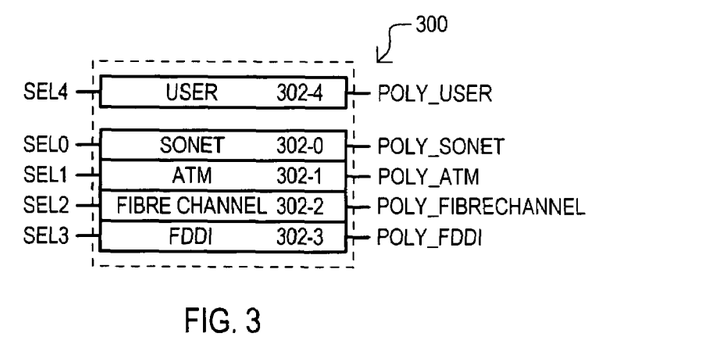
FIG. 3 is a block diagram of one example of an operation control store.

Referring now to FIG. 3, an example of an operation control store is shown in a block diagram and designated by the general reference character 300. An operation control store 300 may include a number of selectable values 302-0 to 302-4. Some selectable values (302-0 to 302-3) may be preset by a manufacturing process, while other selectable values 302-4 can be set by a user. Values preset by a manufacturing process (302-0 to 302-3) may be established by any of a number of steps. As but a few examples, values may be preset as mask ROM values, as "hardwired" logic circuits that generate a desired output value, or as non-volatile memory cells. The example of FIG. 3 shows particular scrambler polynomial values for different serial communication standards.

User set values 302-4 may be established by various steps. User set values 302-4 may be established in a design/synthesis step in a conventional programmable logic configuration process. In addition or alternatively, an operation control store 300 may include memory circuits, such as volatile and/or nonvolatile memory cells that may be configured to store a value, such as a polynomial value. Still further, in alternate embodiments, a user polynomial value may be provided from a source external to an integrated circuit 300. This is in contrast to conventional approaches where a polynomial value is included in a logic design and then synthesized into a particular circuit structure.

Various values stored within an operation control store 300 may be selected by select input signals SEL0 to SEL4. Selected polynomial output values are shown as POLY_USER, POLY_SONET, POLY_ATM, POLY_FIBRE-CHANNEL, POLY_FDDI. As described in conjunction with other embodiments, one of many polynomial output values may be provided to a scrambler circuit by a polynomial output MUX, or the like.

In this way, particular values of an operational control store 300 may be established by a manufacturer, but made selectable for a user. This can increase the flexibility of an embodiment over conventional programmable logic approaches, which may force a user to program one such a value. Still further, a user may include a custom polynomial value that may be changed without necessarily having to re-synthesize a logic design.

Figure 4A:
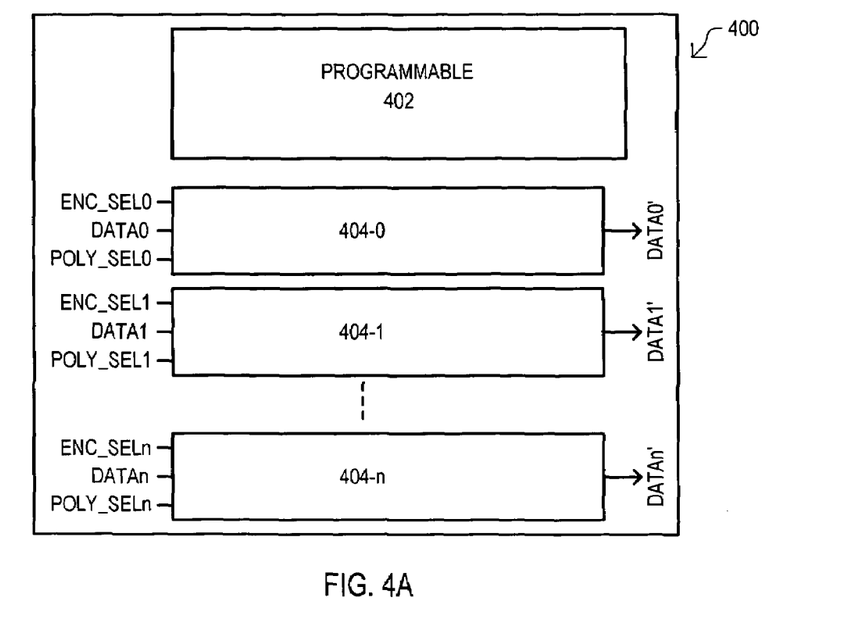
FIGS. 4A and 4B are block diagrams of a fourth and fifth embodiment of the present invention.

Referring now to FIG. 4A, a fourth embodiment is set forth in a block diagram and designated by the general reference character 400. A fourth embodiment 400 may include some of the same general constituents as that set forth in FIG. 1. To that extent, like constituents will be referred to by the same reference character but with the first digit being a "4" instead of a "1."

According to a fourth embodiment 400, an integrated circuit may include a programmable portion 402 similar to, or the same as those shown in FIGS. 1, 2A and 2B. A fourth embodiment 400 may further include multiple communication portions 404-0 to 404-n. Communication portions (404-0 to 404-n) may be similar to, or the same as those shown in FIGS. 1 and 2A.

Multiple communication portions (404-0 to 404-n) may provide even greater flexibility than other described embodiments, as each communication portion (404-0 to 404-n) may be programmed to provide a different function. As but one example, a single IC may be programmed to accommodate functions for multiple serial data communication standards.

Figure 4B:
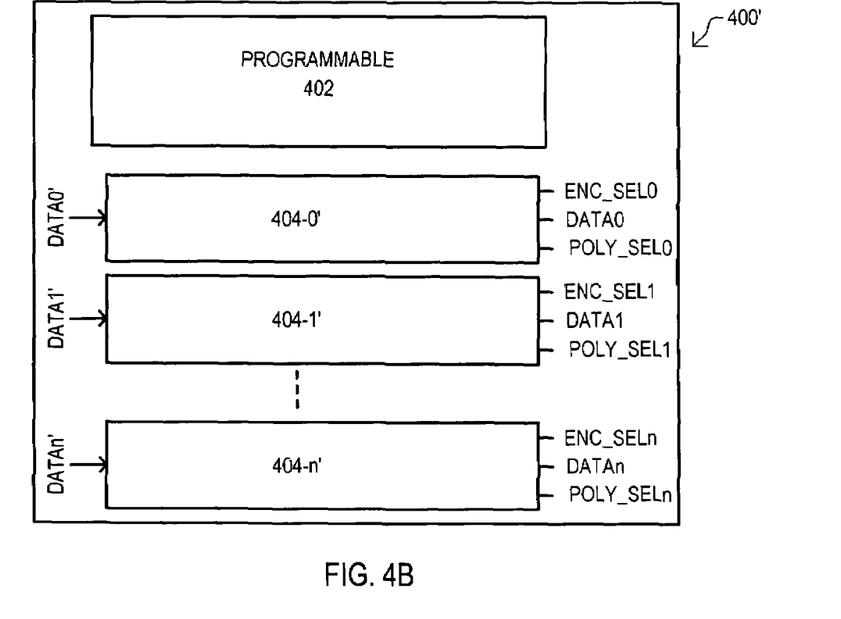

Referring now to FIG. 4B, a fifth embodiment is set forth in a block diagram and designated by the general reference character 400'. A fifth embodiment 400' may include some of the same general constituents as that set forth in FIG. 4A. To that extent, like constituents will be referred to by the same reference character but with an additional apostrophe.

According to a fifth embodiment 400', an integrated circuit may include a programmable portion 402 similar to, or the same as those shown in FIGS. 1, 2A and 2B. A fifth embodiment 400 may further include multiple communication portions 404-0' to 404-n'. Communication portions (404-0' to 404-n') may be similar to, or the same as those shown in FIG. 2B. As in the fourth embodiment 400, a fifth embodiment 400' may provide added flexibility as each communication portion (404-0' to 404-n') may be programmed to provide a different function.

Figure 5:
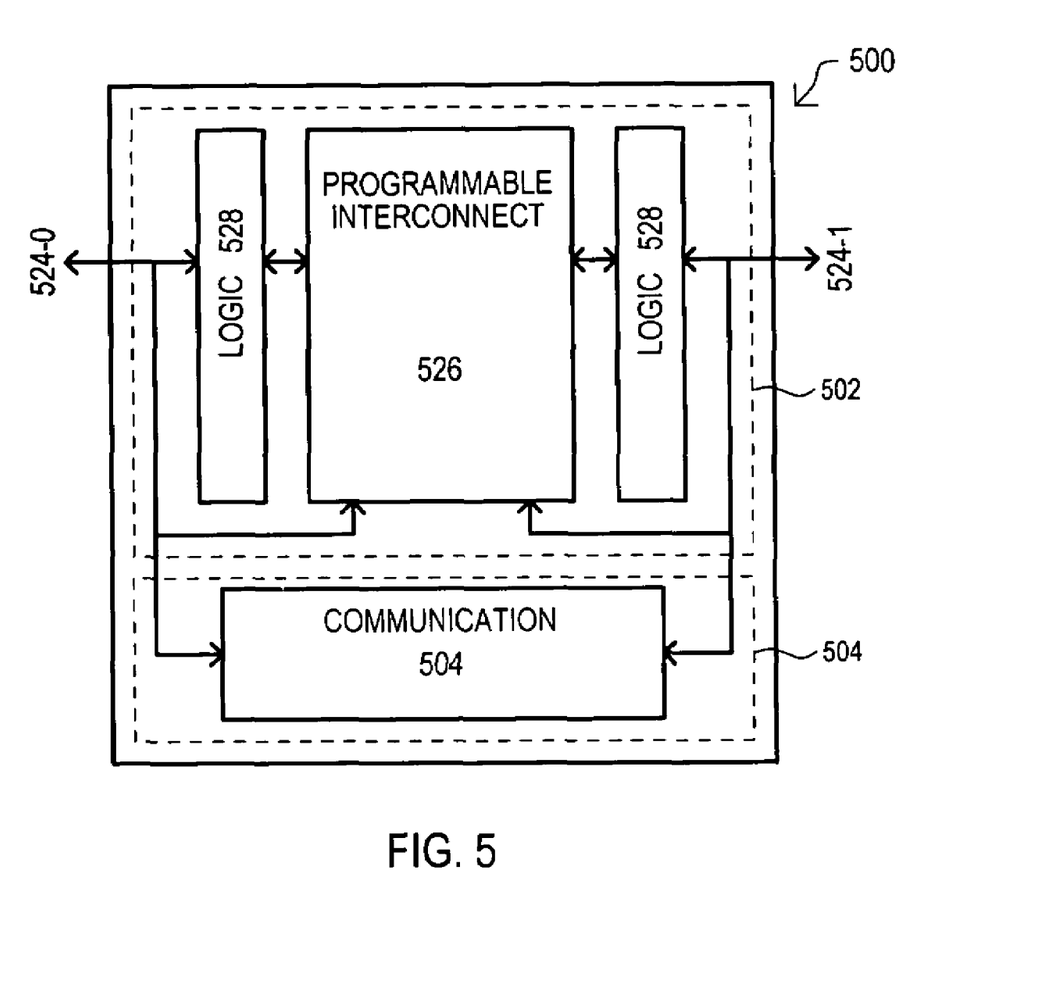
FIG. 5 is block diagram of a sixth embodiment of the present invention.

Referring now to FIG. 5, a sixth embodiment is set forth in a block diagram and designated by the general reference character 500. A sixth embodiment 500 shows one particular example of an input/output (I/O) arrangement. FIG. 5 includes a programmable portion 502 and a communication portion 504. A communication portion 504 may be similar or the same as communication portions described above. Further, while the arrangement of FIG. 5 shows one communication portion, alternate arrangements may include multiple such communication portions as set forth in FIGS. 4A and 4B.

A sixth embodiment 500 may include a number of input/outputs (I/Os). Two particular groups of I/Os are shown as 524-0 and 524-1 in FIG. 5. Further, in the particular example of FIG. 5, I/Os (524-0 and 524-1) may be commonly connected to a programmable portion 502 and a communication portion 504. Even more particularly, I/Os (524-0 and 524-1) may be connected directly to a communication portion 504, or alternatively, may be connected to a communication portion by way of a programmable interconnect 526 and a logic gate section 528.

A direct connection between I/Os (524-0 and 524-1) and a communication portion 504 can reduce propagation delay in a signal, and can aid in meeting strict timing requirements for a communication function.

Connecting I/Os (524-0 and 524-1) to a communication portion 504 by way of a programmable interconnect 526 and a logic gate section 528 may allow for additional flexibility and performance over conventional programmable logic approaches. Such an arrangement may allow custom mapping between selected I/Os and inputs and outputs of a communication portion 504. In addition, or alternatively, additional operations may be performed on data/input signals before being applied to a communication portion 504. Likewise, additional operations may be performed on data output from a communication portion 504.

It is understood that while the various particular embodiments have been set forth herein, methods and structures according to the present invention could be subject to various changes, substitutions, and alterations without departing from the spirit and scope of the invention. Accordingly, the present invention is intended to be limited only as defined by the appended claims.

What is claimed is:

1. An integrated circuit device, comprising:
a programmable portion comprising a plurality of circuits configurable by a user of the integrated circuit device; and
at least one communication portion comprising:
a plurality of data operation circuits, each of which performs a different function on received input data, including at least one circuit block manufactured to perform a predetermined data communication function including converting received first data values into second data values, the at least one circuit including a block converter circuit that converts an input data word into an output data word having different bit values than the input data word in response to a user selectable operational value, and
an operation control store that provides the user selectable operational value from a plurality of operational values to the at least one circuit to control the type of operation performed on the received data; and
a memory circuit for storing configuration information for configuring circuits of the programmable portion.

2. The integrated circuit device of claim 1, wherein:
the programmable portion comprises a programmable interconnect portion and a logic gate portion.

3. The integrated circuit device of claim 1, further including:
a timing circuit that receives a clock signal and generates an internal clock signal that is phase shifted with respect to the clock signal.

4. The integrated circuit device of claim 1, further including:
a plurality of input/outputs commonly connected to the programmable portion and the communication portion.

5. The integrated circuit device of claim 1, wherein:
the data operation circuits include a scrambler circuit that performs a scramble operation on the received data represented by a scrambling polynomial.

6. The integrated circuit device of claim 1, wherein:
the data operation circuits include a scrambler circuit that performs a scramble operation on the received data; and
the operation control store provides operational values that represent at least one scrambling polynomial.

7. The integrated circuit device of claim 1, wherein:
the operational control store includes circuits that provides at least one user operational value configured by a user and preset operational values that are established by at least one integrated circuit manufacturing step.

8. The integrated circuit device of claim 1, wherein:
the communication portion includes a data (MUX) multiplexer that enables a data path between one of a plurality of inputs and a data MUX output, and each data operation circuit is coupled to an input of the data MUX.

9. The integrated circuit device of claim 1, wherein:
the communication portion includes a physical layer circuit that provides a data output stream compatible with a particular data transmission media.

10. The integrated circuit device of claim 1, wherein:
the at least one communication portion includes a plurality of communication portions.

11. A semiconductor device, comprising:
a programmable logic device having a communication portion embedded therein, the communication portion including non-programmable circuits designed to provide a selectable data communication function,
the non-programmable circuits comprising a block converter circuit that encodes input data words into output data words and a scrambler circuit that scrambles data values according to a user selectable scrambling polynomial, and
an operational control store that provides the user selectable scrambling polynomial value to the scrambler circuit from a plurality of user selectable scrambling polynomial values.

12. The semiconductor device of claim 11, wherein:
the communication portion includes a plurality of circuit blocks that each provides a different data communication function.

13. The semiconductor device of claim 12, wherein:
the communication portion includes a selectable data path between each circuit block and a data output.

14. The semiconductor device of claim 11, wherein:
the communication portion includes a block converter circuit that decodes input data words into output data words and a de-scrambler circuit that de-scrambles data values according to an operational control value provided by the operational control store.

15. A method, comprising the steps of:
performing predetermined logic functions on a programmable logic portion of an integrated circuit; and
performing serial data communication functions on a communication portion of the integrated circuit that includes circuit blocks that are not synthesized with programmable logic device configuration data, the serial data communication functions being user selectable between
(i) selectin a polynomial value from a number of user selectable polynomial values, and
scrambling serial data according to the selected polynomial value, or
(ii) encoding serial data having words of a first bit length into serial data having words of a second bit length that is different than the first bit length.

* * * * *